(12) United States Patent  
Tanaka et al.

(10) Patent No.: US 7,566,669 B2  
(45) Date of Patent: Jul. 28, 2009

(54) LASER IRRADIATION APPARATUS AND LASER IRRADIATION METHOD

(75) Inventors: Koichiro Tanaka, Isehara (JP); Yoshiaki Yamamoto, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 375 days.

(21) Appl. No.: 10/584,472

(22) PCT Filed: Jun. 15, 2005

(86) PCT No.: PCT/JP2005/011397

§ 371 (c)(1),
(2), (4) Date: Jun. 23, 2006

(87) PCT Pub. No.: WO2005/124841

PCT Pub. Date: Dec. 29, 2005

(65) Prior Publication Data

US 2007/0148834 A1    Jun. 28, 2007

(30) Foreign Application Priority Data

Jun. 18, 2004    (JP)    ............... 2004-180790

(51) Int. Cl.
*H01L 21/00*    (2006.01)
*C30B 1/00*    (2006.01)
*B23K 26/00*    (2006.01)

(52) U.S. Cl. ............... 438/795; 257/E21.002; 117/8; 219/121.76

(58) Field of Classification Search ............... 438/795, 438/166, 151; 257/E21.002, E21.134, E21.347; 117/8; 219/121.76, 121.6
See application file for complete search history.

(56) References Cited

U.S. PATENT DOCUMENTS

2003/0086182 A1    5/2003    Tanaka et al.
2004/0012844 A1*   1/2004    Ohtsuki et al. ........... 359/341.1

FOREIGN PATENT DOCUMENTS

EP    1 304 186    4/2003

(Continued)

OTHER PUBLICATIONS

International Search Report (Application No. PCT/JP2005/011397) dated Oct. 4, 2005.

(Continued)

*Primary Examiner*—Walter L Lindsay, Jr.
(74) *Attorney, Agent, or Firm*—Eric J. Robinson; Robinson Intellectual Property Law Office, P.C.

(57) ABSTRACT

It is an object of the present invention to provide a laser irradiation apparatus which can manufacture a homogenously crystallized film by varying the energy intensity of an irradiation beam in forward and backward directions of the irradiation. A laser irradiation apparatus of the present invention comprises a laser oscillator and means for varying beam intensity wherein a laser beam is obliquely incident into the irradiation surface, the laser beam is scanned relative to the irradiation surface, and the beam intensity is varied in accordance with the scanning direction. Further, the laser oscillator is a continuous wave solid-state laser, gas laser, or metal laser. A pulsed laser having a repetition frequency of 10 MHz or more can also be used.

47 Claims, 11 Drawing Sheets

ELECTRON MOBILITY DISTRIBUTION of N-ch TFT

FOREIGN PATENT DOCUMENTS

| | | |
|---|---|---|
| JP | 2000-340503 | 12/2000 |
| JP | 2003-257885 | 9/2003 |
| JP | 2004-114065 | 4/2004 |
| JP | 2004-172424 | 6/2004 |

OTHER PUBLICATIONS

Written Opinion (Application No. PCT/JP2005/011397) dated Oct. 4, 2005.

* cited by examiner

ELECTRON MOBILITY vs. ENERGY DENSITY of N-ch TFT

FIG. 4    ELECTRON MOBILITY DISTRIBUTION of N-ch TFT

LASER IRRADIATION APPARATUS AND LASER IRRADIATION METHOD

TECHNICAL FIELD

The present invention relates to a laser irradiation apparatus (an apparatus including a laser and an optical system to lead a laser beam outputted from the laser to an irradiation body) and a laser irradiation method for annealing, for example, a semiconductor material effectively and homogeneously.

BACKGROUND ART

In recent years, a technique to manufacture a thin film transistor (hereinafter referred to as a TFT) over a substrate has made great progress and application to an active matrix display device has been advanced. In particular, since a TFT using a poly-crystalline semiconductor film has higher field-effect mobility than a conventional TFT using an amorphous semiconductor film, high-speed operation has become possible. Therefore, it has been tried to control a pixel by a driver circuit formed over the same substrate as the pixel, which has been conventionally provided outside the substrate.

With the increase of the demand for semiconductor devices, it has been required to manufacture the semiconductor devices at lower temperature in shorter time. A glass substrate, which is superior to a quartz substrate in terms of cost, has been employed as a substrate for a semiconductor device. In the case of forming a TFT with a poly-crystalline semiconductor film over a glass substrate, although a glass substrate is sensitive to heat and easy to deform due to the heat, a semiconductor film can be easily crystallized at low temperature by employing laser annealing.

In addition, compared with another annealing method which uses radiant heat or conductive heat, the laser annealing has advantages that the processing time can be shortened drastically and that a semiconductor film over a substrate can be heated selectively and locally so that almost no thermal damage is given to the substrate.

As laser oscillators used in the laser annealing, there are pulsed laser oscillators and continuous wave (CW) laser oscillators according to their oscillation methods. An excimer laser has advantages of high output power and capability of repetitive irradiation at high repetition frequency. Moreover, a laser beam emitted from the excimer laser has an advantage of high absorption coefficient to a silicon film, which is often used as a semiconductor film. It is preferable to perform the laser irradiation in such a way that a laser beam is transformed into a rectangular, linear, or elliptical shape on an irradiation surface by an optical system and then the beam is scanned relative to the irradiation surface in a minor-axis direction of the rectangular, linear, or elliptical beam, because this method provides high productivity and is superior industrially. At present, a liquid crystal display and an EL (electroluminescent) display are often manufactured by forming TFTs with a semiconductor film crystallized according to this technique.

On the other hand, when a laser beam emitted from a continuous wave laser (the laser beam is hereinafter referred to as a CW laser beam) is transformed into a rectangular, linear, or elliptical shape and the substrate is moved relatively in the minor-axis direction of the rectangular, linear, or elliptical beam, a large grain crystal extending long in the moving direction can be formed. In the case of manufacturing a TFT in accordance with the major-axis direction of the large grain crystal, the TFT has higher mobility than a TFT manufactured with the excimer laser. Since a circuit can be driven at high speed by using the TFT formed with the CW laser beam, a driver circuit for driving a display, a CPU, and the like can be manufactured.

Conventionally, a laser irradiation apparatus shown in FIG. 8 has been known. This laser irradiation apparatus comprises a plurality of cylindrical lens arrays and the like. A laser beam emitted from a laser oscillator 1 is divided into a plurality of beams using a plurality of cylindrical lens arrays 2 to 6 and condensed. Then, after the laser beams are reflected on a mirror 7, the laser beams are condensed into one rectangular, linear, or elliptical laser beam with a doublet cylindrical lens 8 consisting of two cylindrical lenses. After that, the laser beam is delivered vertically to an irradiation surface 9. By delivering the rectangular, linear, or elliptical beam to the irradiation surface while moving the beam relatively in the minor-axis direction of the linear beam, the whole surface of an amorphous semiconductor can be annealed so that the amorphous semiconductor is crystallized, the crystallinity thereof is enhanced, or an impurity element is activated.

However, since the conventional laser irradiation apparatus needs to use a plurality of expensive cylindrical lens arrays and to arrange them so as to form a desired rectangular, linear, or elliptical beam as described above, the apparatus has a problem in that the size and cost thereof increase. Further, since the laser beam, which has been shaped into a rectangular, linear, or elliptical spot is delivered vertically to the irradiation surface, that is, a surface of a semiconductor film formed over a substrate, the beam being incident from above the semiconductor film passes through the substrate and is reflected at a bottom surface of the substrate. Then, the beam incident from above interferes with the beam reflected at the bottom surface. Thus, sometimes a homogeneous crystalline semiconductor film cannot be manufactured.

The present applicant has already suggested a compact and inexpensive laser irradiation apparatus which has overcome the problems of the conventional laser irradiation apparatus. The laser irradiation apparatus is illustrated in FIG. 9. This laser irradiation apparatus uses a convex lens 13 into which the laser beam is incident obliquely so that the laser beam is extended to form a rectangular, linear, or elliptical beam 14. Then, the extended beam is delivered to an irradiation surface 15 obliquely.

That is to say, this laser irradiation apparatus comprises a laser oscillator 11, a mirror 12, the convex lens 13, and the like. A laser beam emitted from the laser oscillator 11 is reflected on a mirror 12 and incident obliquely into the convex lens 13 so that the laser beam is shaped into the rectangular, linear, or elliptical beam 14. The beam 14 is delivered to the irradiation surface 15. With this structure, the apparatus can be made small, and the adverse effect due to the interference caused by the reflected beam from the bottom surface of the substrate can be prevented (see Reference 1: Japanese Patent Application Laid-Open No. 2003-257885).

However, the above laser irradiation apparatus still has the following problem. Although laser annealing is performed with a CW laser beam, for example with a CW laser beam providing 10 W at 532 nm having a rectangular shape of 300 μm in its major-axis direction and 10 μm in its minor-axis direction, the width of the large grain crystal formed by one scanning is as narrow as approximately 200 μm. For this reason, in order to crystallize the whole surface of the substrate effectively by the laser annealing, the laser beam needs to be scanned back and forth while displacing the laser beam by the width of the large grain crystal formed by one scanning of the beam. At this time, if the intensity distribution of the laser beam in the minor-axis direction is not symmetric along a plane which passes through the center of the minor axis of the beam, which is perpendicular to the substrate, and which is parallel to the major axis of the beam, the crystallization state after the laser annealing may be different between back scanning and forth scanning.

However, when the rectangular, linear, or elliptical beam is delivered obliquely to the irradiation surface and the substrate is moved in the minor-axis direction of the beam, the state of the laser beam delivered to the amorphous semiconductor film is different according to the scanning direction of the laser beam as described later. Thus, homogeneous crystallization is difficult to be performed.

DISCLOSURE OF INVENTION

The present invention is to solve the above problems, and specifically, it is an object of the present invention to provide a laser irradiation apparatus and a laser irradiation method which can manufacture a homogeneously crystallized film by varying the energy density of an irradiation beam according to forward and backward scanning directions.

To achieve the above object, the present invention employs a constitution below. It is to be noted that the laser annealing method herein described indicates a technique to crystallize an amorphous region or a damaged region formed by adding ions to a semiconductor substrate or a semiconductor film, a technique to crystallize a semiconductor film by irradiating an amorphous semiconductor film formed over a substrate with a laser beam, a technique to crystallize a semiconductor film which is not single crystal (the above semiconductor films which are not single crystals are generically referred to as a non-single crystal semiconductor film) by laser irradiation after introducing an element for promoting crystallization such as nickel into the semiconductor film, and so on. Moreover, the laser annealing includes a technique applied to planarization or modification of the surface of a semiconductor substrate or a semiconductor film.

According to an aspect of the present invention disclosed in this specification, a laser irradiation apparatus comprises a laser oscillator, means for varying beam intensity, and a convex lens or a diffractive optical element, wherein a laser beam is incident into an irradiation surface, wherein the laser beam is scanned relative to the irradiation surface, and wherein the means for varying beam intensity varies the beam intensity in every scanning direction.

According to another aspect of the present invention, a laser irradiation apparatus comprises a laser oscillator, means for varying beam intensity, and a convex lens or a diffractive optical element, wherein a laser beam is incident into an irradiation surface, wherein the laser beam is scanned relative to the irradiation surface, wherein the means for varying beam intensity varies the beam intensity in every scanning direction, and wherein the crystallization state after the laser annealing at the irradiation surface is homogeneous in all the scanning directions.

In the above constitution, the laser beam may be incident obliquely into the irradiation surface.

According to another aspect of the present invention, the laser beam passed through the convex lens or the diffractive optical element has a rectangular, linear, or elliptical shape on the irradiation surface.

According to another aspect of the present invention, the means for varying beam intensity is a polarizing plate. The number of the polarizing plates may be more than one.

According to another aspect of the present invention, the laser oscillator is a CW solid-state laser, gas laser, or metal laser, or a pulsed solid-state laser, gas laser, or metal laser. As the solid-state laser, there are a YAG laser, a $YVO_4$ laser, a YLF laser, a $YAlO_3$ laser, a $GdVO_4$ laser, a $Y_2O_3$ laser, a glass laser, a ruby laser, an alexandrite laser, a Ti:sapphire laser, and the like. As the gas laser, there are an Ar laser, a Kr laser, a $CO_2$ laser, and the like. As the metal laser, there are a copper vapor laser, a gold vapor laser, and the like. As the pulsed laser, a $YVO_4$ laser, a $GdVO_4$ laser, a YAG laser, and the like which have a repetition frequency of 10 MHz or more can be used.

According to another aspect of the present invention, a laser beam emitted from the laser oscillator is converted into a harmonic by a non-linear optical element.

According to another aspect of the present invention, a laser beam is emitted from a laser oscillator, the laser beam passes through means for varying beam intensity which can vary the beam intensity according to a scanning direction of the laser beam, the laser beam passes through a convex lens or a diffractive optical element, and then the laser beam is incident into an irradiation surface. Further, by scanning the laser beam relative to the irradiation surface, the irradiation surface can be annealed equally in all the scanning directions. The laser beam may be incident obliquely into the irradiation surface.

According to the present invention, since the laser beam is delivered obliquely to the irradiation surface, the interference between the incident beam and the reflected beam from the bottom surface of the substrate can be suppressed and a laser beam with homogenous energy distribution can be delivered to the irradiation surface. Thus, a non-single crystal semiconductor film over a substrate can be annealed homogeneously.

Next, the beam intensity is changed by a polarizing plate or the like, which is the means for varying beam intensity, in accordance with the scanning direction. Specifically, the laser beam is scanned on the whole irradiation surface as single-stroke drawing while changing the scanning direction in the forward or backward direction. Thus, the whole non-single crystal semiconductor film over a substrate can be crystallized homogeneously. With the CW laser or the pulsed laser having a repetition frequency of 10 MHz or more, a large grain crystal can be manufactured; therefore, a TFT having high mobility can be manufactured.

For this reason, the variation in the electrical characteristic can be decreased, and the reliability can be enhanced. By applying the present invention to a mass-production line of TFTs, TFTs having high operating characteristics can be produced effectively. As a result, a semiconductor device, typically an active matrix type liquid crystal display device and an active matrix EL display device, having high operating characteristic and high reliability can be achieved. Further, in a manufacturing process of the semiconductor device, margin can be expanded and the yield can be boosted; therefore manufacturing cost of the semiconductor device can be decreased.

BEST MODE FOR CARRYING OUT THE INVENTION

Embodiment 1

Figure 1:
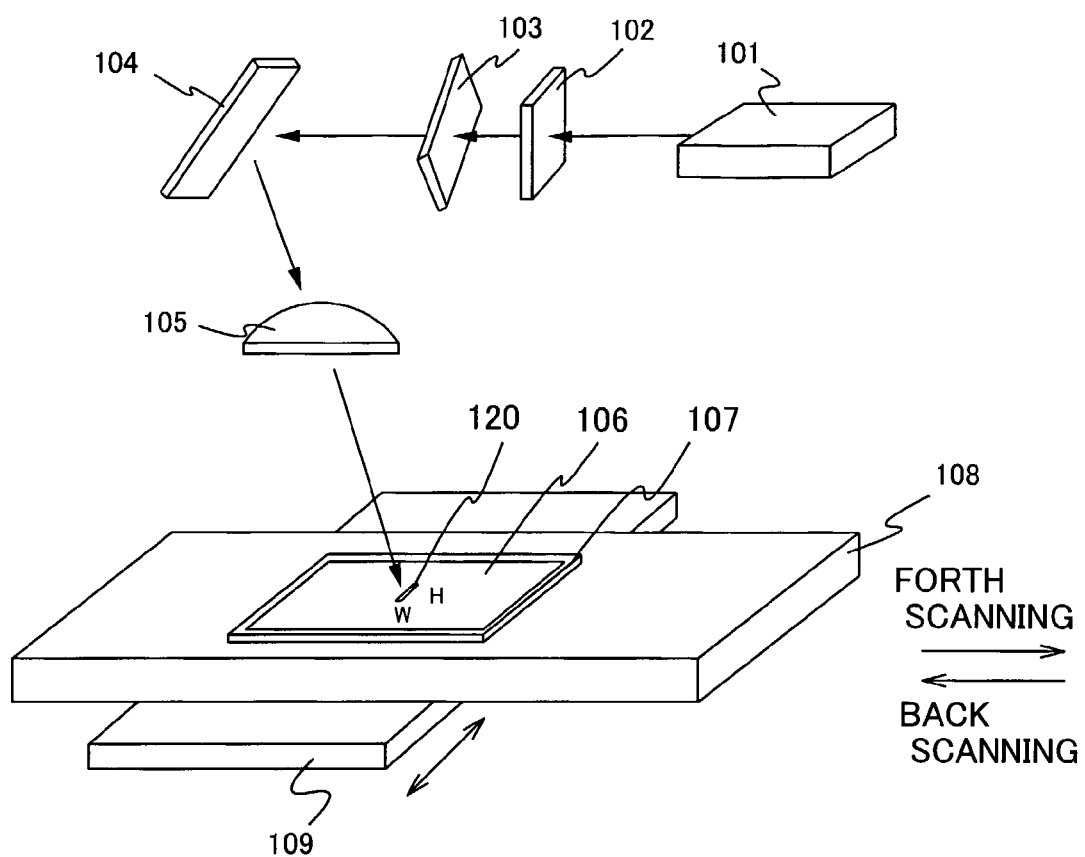
FIG. 1 schematically shows a laser irradiation apparatus according to the present invention.

FIG. 1 shows an example of a laser irradiation apparatus. First, a substrate 107 with a non-single crystal semiconductor film 106 formed is prepared. The substrate 107 is set over an X-axis stage 108 and a Y-axis stage 109. The substrate 107 can be moved freely in X-axis and Y-axis directions by moving the X-axis stage 108 and the Y-axis stage 109 in directions indicated with arrows respectively by a motor which is not shown. The X-axis stage 108 is scanned in forward and backward directions indicated with arrows.

The laser irradiation apparatus comprises a laser oscillator 101, two polarizing plates 102 and 103, a mirror 104, and a convex lens 105. The laser oscillator 101 is a CW laser oscillator. As a CW solid-state laser, there are a YAG laser, a $YVO_4$ laser, a YLF laser, a $YAlO_3$ laser, a $GdVO_4$ laser, a $Y_2O_3$ laser, an alexandrite laser, and a Ti:sapphire laser. As a CW gas laser, there are an Ar laser, a Kr laser, and a $CO_2$ laser. Not only the CW laser but also a pulsed laser can be used. As the pulsed laser, a $YVO_4$ laser, a $GdVO_4$ laser, a YAG laser, or the like which has a repetition frequency of 10 MHz or more can be used.

A laser beam emitted from the laser oscillator 101 is desirably converted into a harmonic by a non-linear optical element. For example, it is known that the YAG laser emits a laser beam with a wavelength of 1065 nm. The absorption coefficient of this laser beam to a silicon film is very low, and it is technically difficult to crystallize an amorphous silicon film, which is one of semiconductor films, with this laser beam. However, by using a non-linear optical element, the laser beam can be converted into a shorter wavelength. As the harmonic, the second harmonic (532 nm), the third harmonic (355 nm), the fourth harmonic (266 nm), and the fifth harmonic (213 nm) are given. Since these harmonics have high absorption coefficient to an amorphous silicon film, the harmonics can be used for crystallizing the amorphous silicon film.

The polarizing plate 102 (103) corresponds to the means for varying beam intensity according to the present invention. The polarizing plate is a component which passes only light vibrating in a certain direction among the light vibrating in all directions of 360° and which blocks the light vibrating in the other directions except the certain direction. Specifically, the intensity of a laser beam emitted from the laser oscillator 101 can be changed as desired by adjusting the angles between transmission axes of the two polarizing plates 102 and 103. In the case of using such means for varying beam intensity, it is preferable to use a laser beam with the polarization ratio of 100:1 or more. This makes it possible for the polarizing plate to adjust the energy within the range of approximately 0 to 99%.

Specifically, for example, the polarizing plate 102 is fixed, and the polarizing plate 103 is set so that the polarizing plate 103 can freely rotate either in a positive or negative direction. Then, by rotating the polarizing plate 103 at a predetermined angle in the positive or negative direction, the intensity of the laser beam which has passed through the two polarizing plates 102 and 103 and travels to the mirror 104 can be changed. By changing the rotating angle as desired, the intensity of the laser beam can be changed to be any intensity. It is to be noted that the number of the polarizing plates may be one, or more than two.

When a laser beam obliquely enters the convex lens 105 from above, the incident beam having an approximately circular shape is extended long in a direction perpendicular to the direction indicated with the arrow, which is the moving direction of the X-axis stage 108, due to the astigmatism of the lens at a position where a focal line is formed. Then, a beam 120 on the irradiation surface has a rectangular, linear, or elliptical shape with the minor-axis length W and the major-axis length H. Since focal lines can be formed at two locations, whichever may be chosen. However, because the two focal lines intersect with each other, a practitioner needs to select appropriately. For the details, the reference 1 may be referred to.

In this case, the major-axis beam length H can be made longer by shortening the minor-axis beam length W. It is preferable to scan the beam 120 in its minor-axis direction because the region where the laser beam can be scanned at one time can be enlarged, which increases the productivity.

A procedure for annealing the non-single crystal semiconductor film 106 with the laser irradiation apparatus is described. First, by moving the X-axis stage 108 and the Y-axis stage 109, the substrate 107 is moved to a position where the annealing starts. Then, a CW laser beam is emitted from the laser oscillator 101, and the beam intensity of the CW laser beam is adjusted by the polarizing plates 102 and 103 to be as high as possible but within the range where the film is not peeled (the non-single crystal semiconductor film is not ablated). The adjusted beam having an approximately circular shape is reflected on the mirror 104, and then enters obliquely the apex of the convex lens 105. The beam is elongated with the convex lens 105 so that the beam has a rectangular, linear, or elliptical shape with the minor-axis length W in the moving direction indicated with an arrow of the X-axis stage 108 and the major-axis length H in the direction perpendicular to the moving direction. Then, the beam is delivered obliquely to the non-single crystal semiconductor film 106.

Then, the X-axis stage 108 is moved in the forward direction, which is the same direction as the direction where the laser beam is incident, to anneal the non-single crystal semiconductor film 106. The X-axis stage 108, when having reached the end of the forward direction, stops to move, and then the Y-axis stage 109 is moved in the Y-axis direction by approximately the length corresponding to the major-axis length H.

Subsequently, one of the polarizing plates 102 and 103 is rotated by a predetermined angle in the positive or negative direction to decrease the beam intensity. At the same time, the X-axis stage 108 is moved in a backward direction, which is the direction toward the direction where the laser beam is incident, to anneal the non-single crystal semiconductor film 106. The X-axis stage 108, when having reached the end in the backward direction, stops to move, and then the Y-axis stage 109 is moved in the Y-axis direction by approximately the length corresponding to the major-axis length H.

Subsequently, one of the polarizing plates 102 and 103 is rotated by a predetermined angle in the positive or negative direction, and the beam intensity is increased to be the original high beam intensity. Then, the X-axis stage 108 is moved in the forward direction, which is the same direction as the direction where the laser beam is incident. After that, by repeating the above operation, the whole surface of the non-single crystal semiconductor film 106 can be annealed continuously as single-stroke drawing so that the non-single semiconductor film 106 is crystallized. Although the whole surface of the substrate can be annealed by scanning the beam in one of the forward and backward directions without changing the beam intensity, this annealing method is low in productivity, because the throughput by this method is a half of that by the annealing method performed while scanning the beam in both forward and backward directions.

By annealing the whole surface of the non-single crystal semiconductor film 106 according to this procedure, the whole surface thereof can be crystallized homogeneously.

Figure 3:
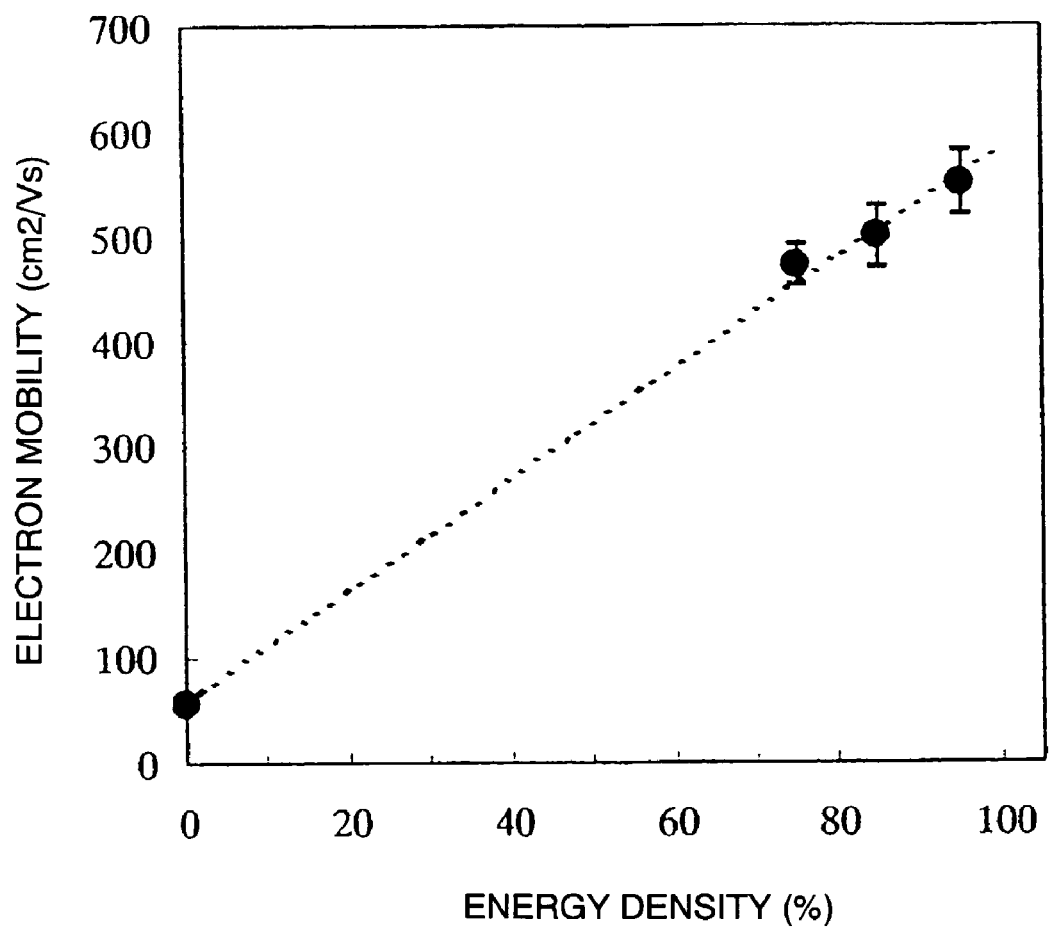
FIG. 3 is a graph showing the relation between the energy density and the electron mobility of a TFT.

Next, the reason why the beam intensity has to be changed by the polarizing plate 102 (103) is described. According to the experiments of the present inventors, it has been confirmed that the laser beam having higher energy density can manufacture a TFT having higher mobility. FIG. 3 is a graph showing the result of the experiment on the average value of the electron mobility of an n-ch TFT and the energy density of the laser beam. The horizontal axis shows the proportion of the energy density of the laser beam when it is assumed that the threshold of the energy density at which the semiconductor film is ablated is 100%, and the vertical axis shows the average value of the electron mobility of the manufactured TFTs. It is understood from FIG. 3 that the TFT having higher electron mobility can be manufactured when the semiconductor film is annealed with the laser beam having higher energy density within the range of the threshold or less.

Figure 4:
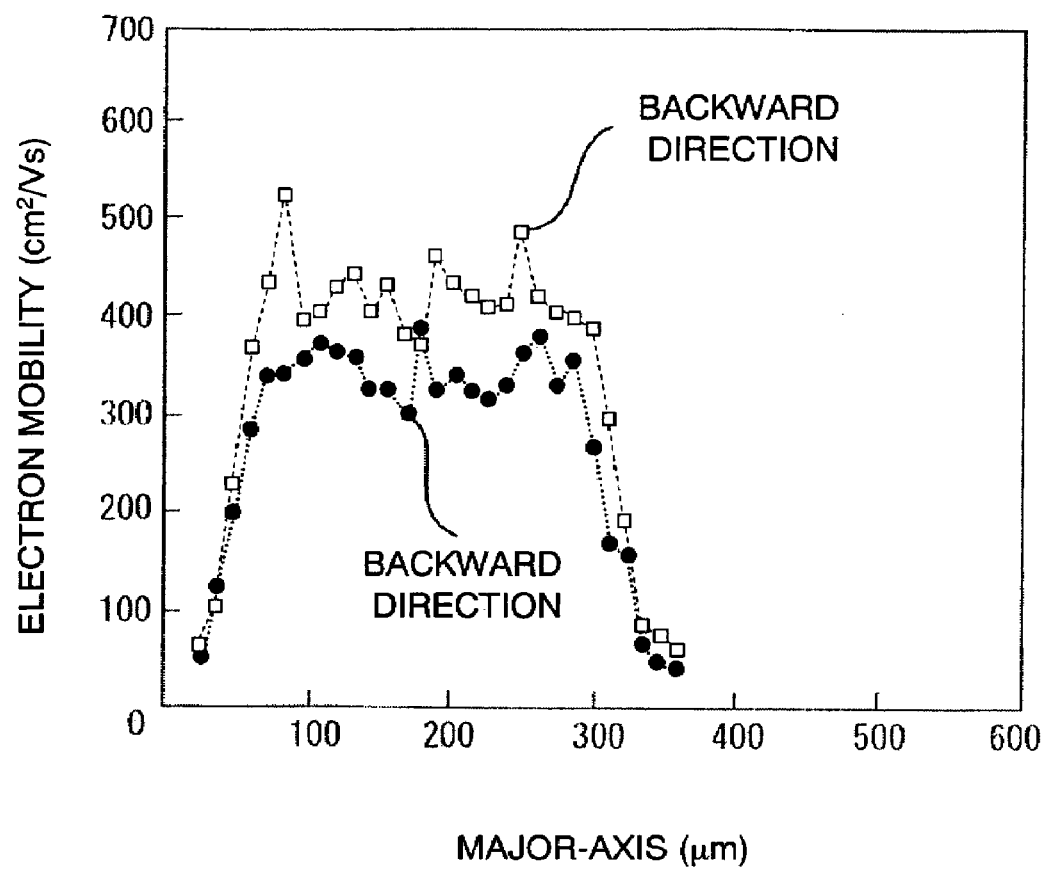
FIG. 4 is a graph showing the distribution of the electron mobility of a TFT.

However, the annealing with a laser beam having the same beam intensity in the forward and backward directions using the laser irradiation apparatus shown in FIG. 1 has the problem shown in FIG. 4. FIG. 4 shows the result of the experiment in the case of annealing with the laser beam having the same beam intensity in the forward and backward directions using the laser irradiation apparatus shown in FIG. 1. In FIG. 4, the horizontal axis shows the major-axis direction of a rectangular beam, while the vertical axis shows the electron mobility of the manufactured TFT.

As this result shows, in the case of irradiating the irradiation surface obliquely with a laser beam by the laser irradiation apparatus, the TFT manufactured by scanning the laser beam in the forward direction generally has approximately 30% lower electron mobility than the TFT manufactured by scanning the laser beam in the backward direction. It is not preferable to manufacture TFTs using a semiconductor film having such variation.

Figure 5:
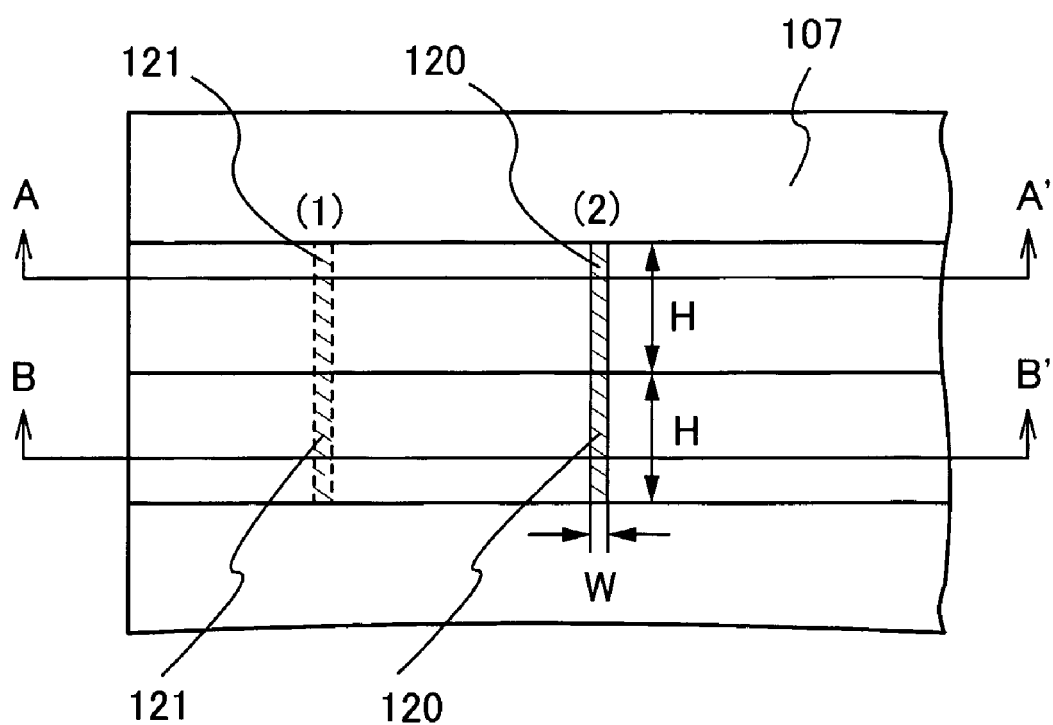
FIG. 5 shows the state of a plane of a substrate.
Figure 6:
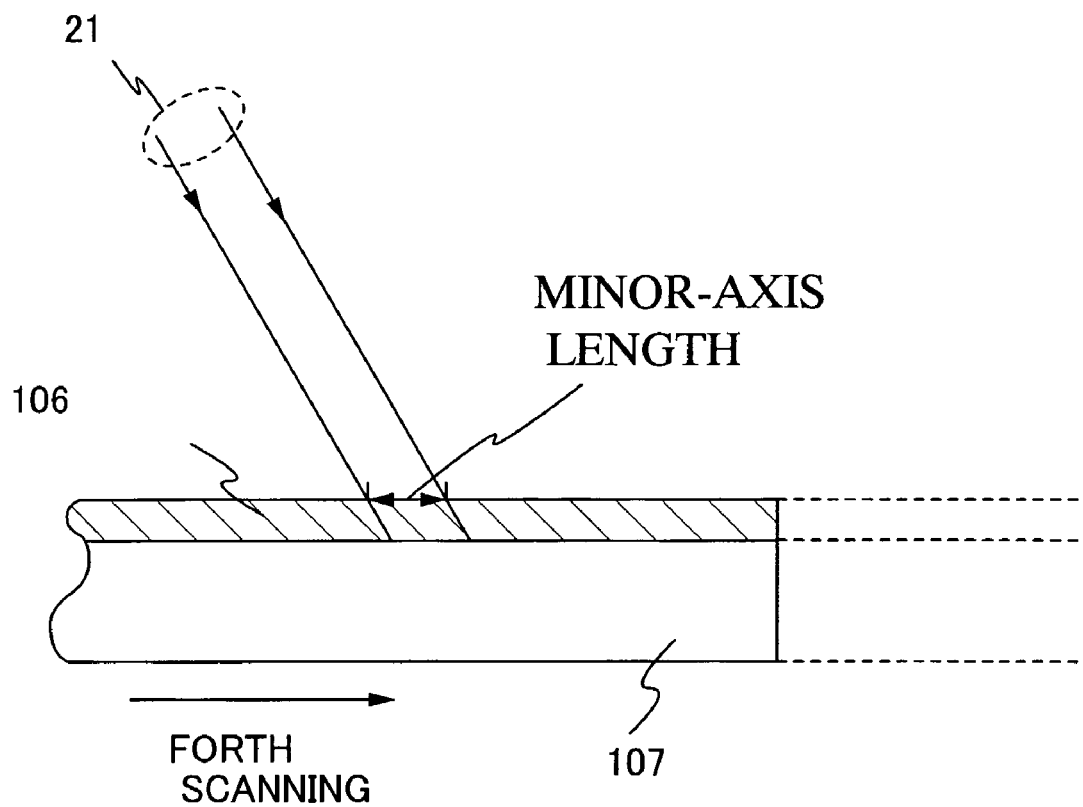
FIG. 6 is a cross-sectional view taken along a line A-A' of FIG. 5.
Figure 7:
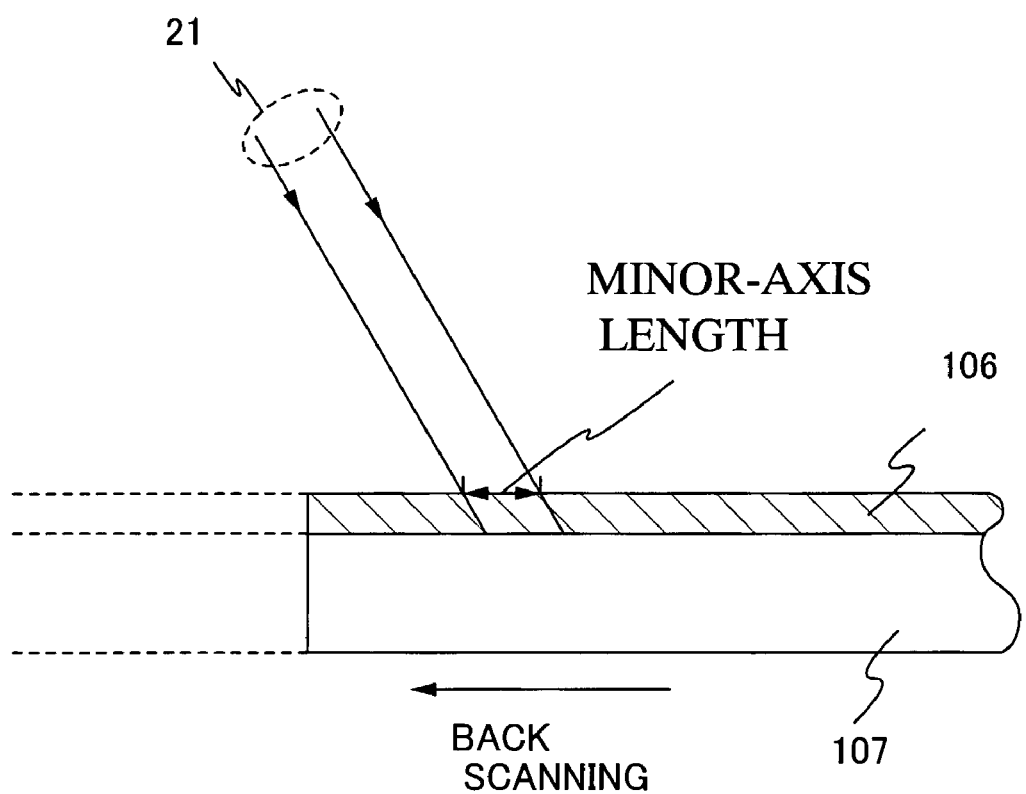
FIG. 7 is a cross-sectional view taken along a line B-B' of FIG. 5.
Figure 8:
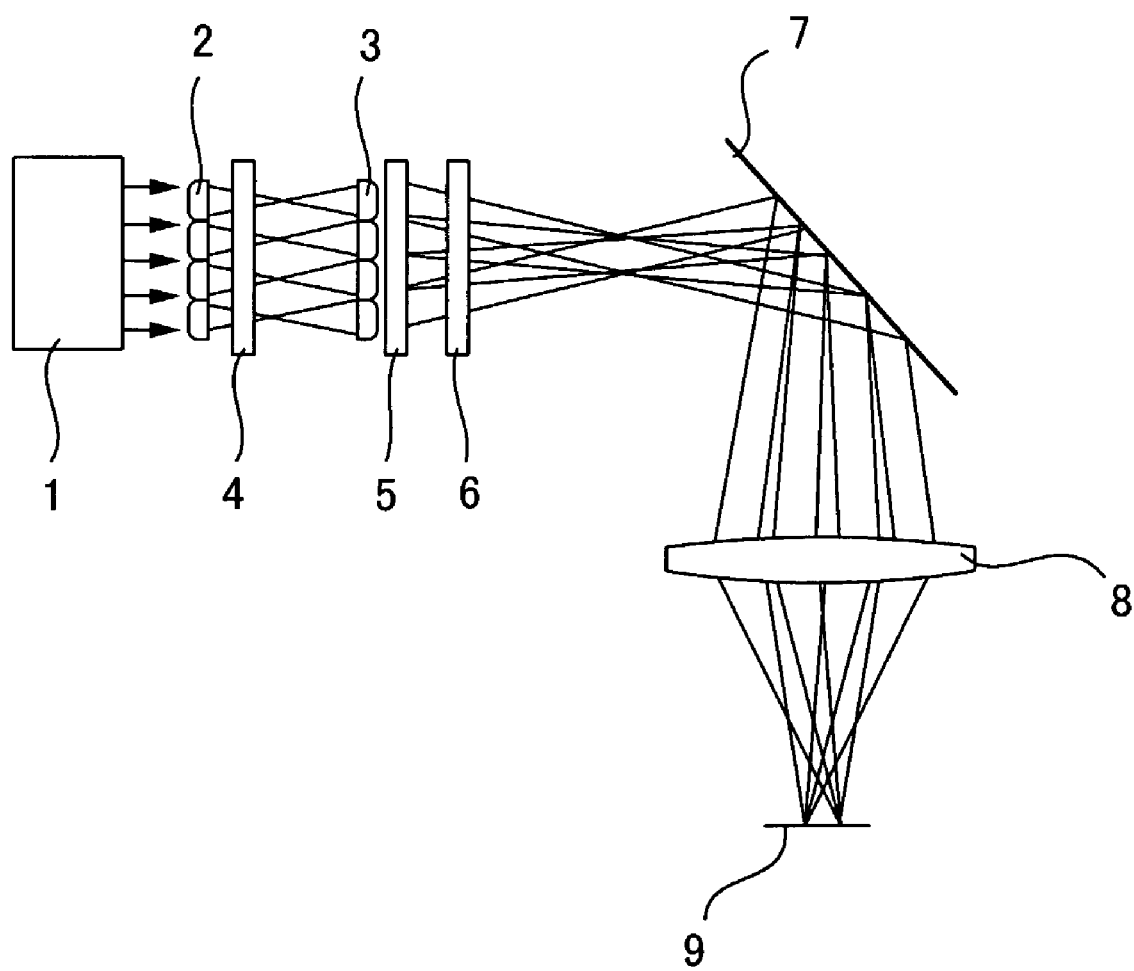
FIG. 8 schematically shows a conventional laser irradiation apparatus.
Figure 9:
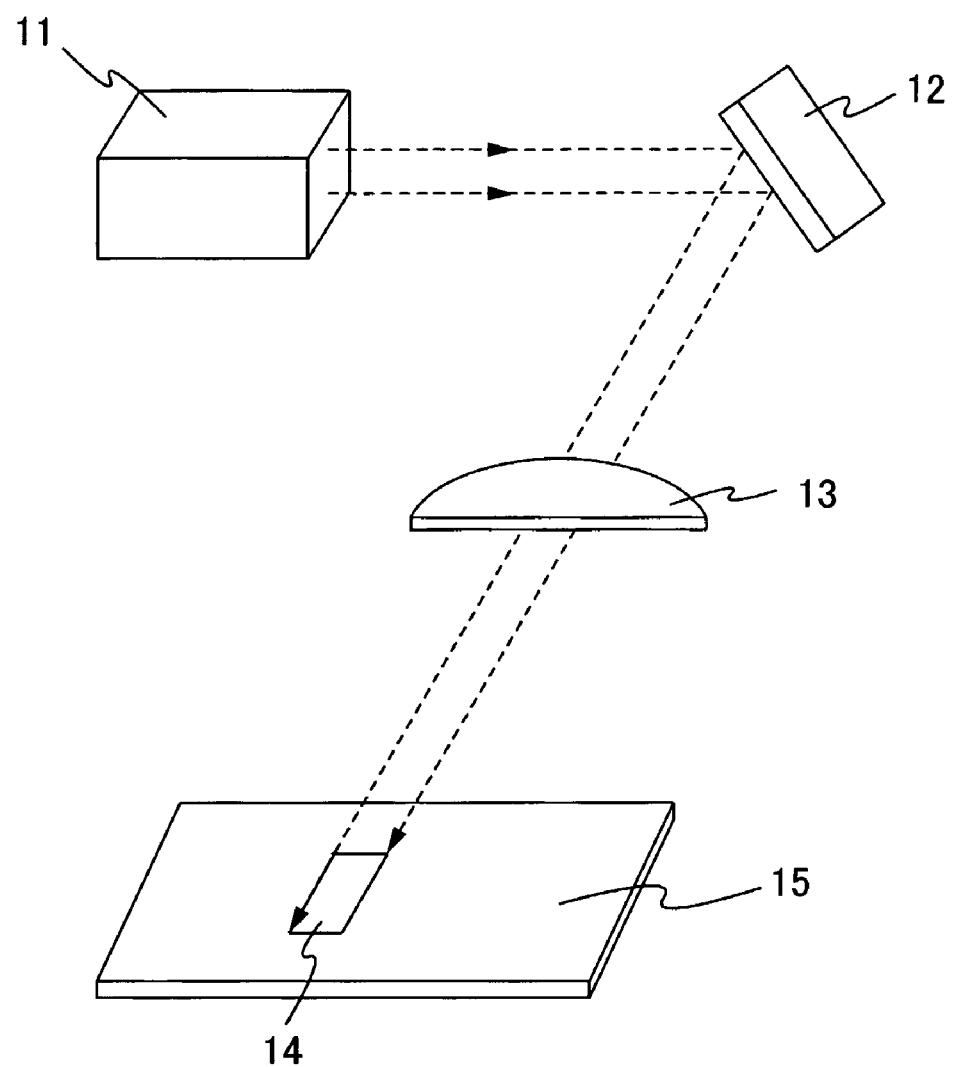
FIG. 9 schematically shows another conventional laser irradiation apparatus.

The reason why the result shown in FIG. 4 is brought is described with reference to FIGS. 5 to 7. FIG. 5 is a plain view of the substrate which is seen from above. FIG. 6 is a cross-sectional view taken along A-A', which shows the forward scanning direction. FIG. 7 is a cross-sectional view taken along B-B', which shows the backward scanning direction. As shown in FIG. 5, an incident beam 121 having a rectangular, linear, or elliptical shape, which is formed with the convex lens 105 and delivered to the non-single crystal semiconductor film 106, is scanned from a position (1) to a position (2) on the non-single crystal semiconductor film as a rectangular, linear, elliptical beam 120 having the minor-axis length W and the major-axis length H. In this embodiment, the beam 120 has a rectangular shape.

This beam is delivered to the non-single crystal semiconductor film 106 as shown in FIGS. 6 and 7. The intensity distribution of the laser beam at the irradiation is not symmetric along a plane which passes through the center of the minor axis of the beam, which is perpendicular to the substrate, and which is parallel to the major axis of the beam even after adjusting the optical system in any way. In other words, the intensity distribution of the laser beam in the minor-axis direction is asymmetric along this plane. Therefore, the irradiation surface is not annealed in the same way in the forward and backward directions. Since the minor axis of the beam is as short as approximately 10 μm, it is difficult to measure the intensity distribution of the beam in the minor-axis direction whether the intensity distribution is symmetric or not along this plane. Further, it is much more difficult to adjust the intensity distribution of the laser beam in the minor-axis direction so as to be symmetric along this plane.

The characteristic of an electrical circuit follows a TFT having the lowest electron mobility among TFTs included in the electrical circuit. Therefore, when TFTs are manufactured using a semiconductor film annealed by scanning the laser beam in directions shown in FIGS. 6 and 7 alternately, the whole follows the characteristic of a TFT in the forward direction where the electron mobility is low.

Accordingly, the energy of the laser beam is preferably increased in the forward direction to such a degree that the electron mobility of the TFT becomes as high as possible but the film is not ablated and so on, while the energy of the laser beam is preferably decreased in the backward direction to such a degree that the film is not ablated and so on because of the excessive energy.

That is to say, when the laser beam is scanned in the forward direction, the polarizing plate 102 (103) is rotated in the positive or negative direction so as to increase the beam intensity of the incident beam 121. Meanwhile, when the laser beam is scanned in the backward direction, the polarizing plate 102 (103) is rotated in the positive or negative direction so as to decrease the intensity of the incident beam 121. As a result, the whole surface of the non-single crystal semiconductor film 106 can be crystallized homogenously with high energy.

Thus, in the case of annealing the non-single crystal semiconductor film 106 by scanning the laser beam in the forward and backward directions, the energy of the laser beam is increased when the beam is scanned in the direction where the mobility is lower, and the energy thereof is decreased when the beam is scanned in the direction where the mobility is higher. Thus, the variation of the crystallization can be suppressed.

The rectangular beam 120 being incident into the substrate 107 has a size of approximately 150 to 400 μm in the major-axis direction and approximately 1 to 30 μm in the minor-axis direction. In the size of the beam 120, the length in the major-axis direction may be determined in accordance with the length in the minor-axis direction so that enough energy density can be provided. The upper limit of the length in the minor-axis direction is approximately 30 μm, while the lower limit thereof is approximately 1 μm. Out of this range, the large grain crystal having high characteristic is difficult to manufacture. Actually, in the case of a CW laser beam with 10 W which has a length of approximately 10 μm in the minor-axis direction, the length thereof in the major-axis direction is approximately 400 μm. In the case of a CW laser beam with 3 W which has a length of approximately 8 μm in the minor-axis direction, the length thereof in the major-axis direction is approximately 150 μm.

Figure 2:
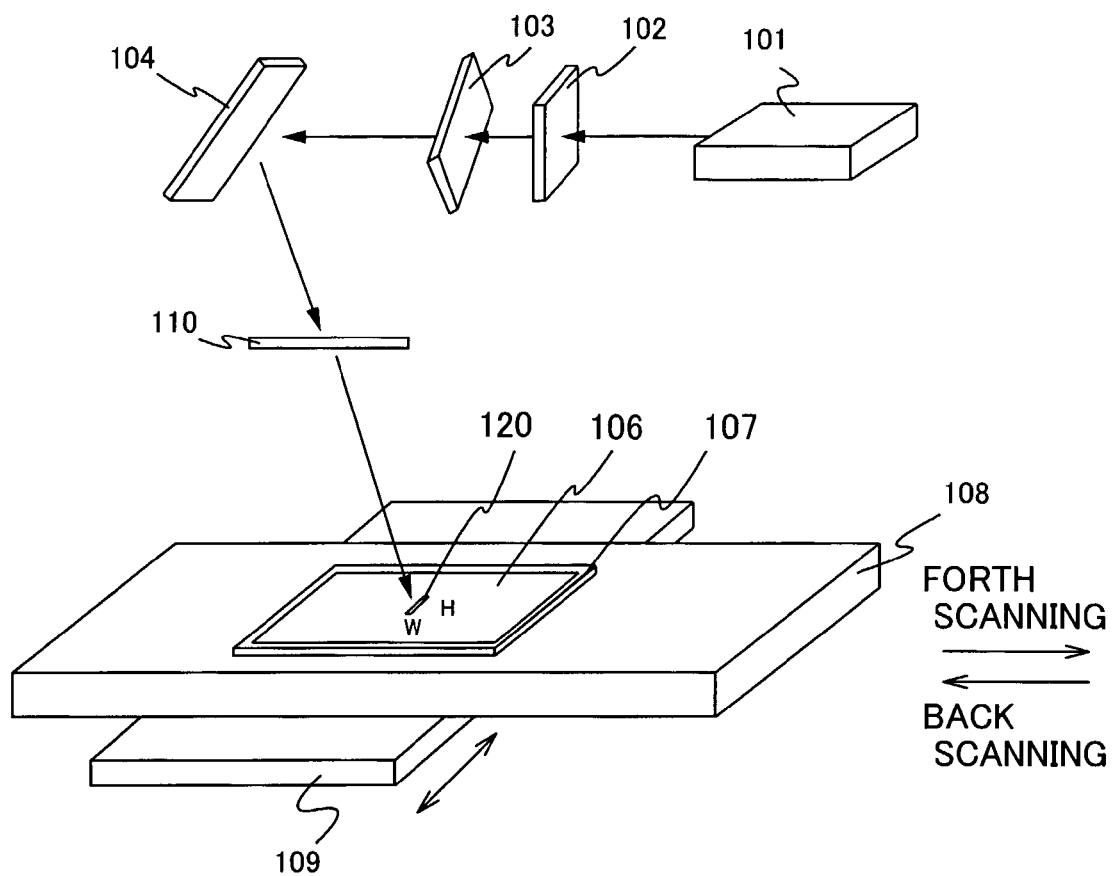
FIG. 2 schematically shows another laser irradiation apparatus according to the present invention.

FIG. 2 shows an example of another laser irradiation apparatus. This laser irradiation apparatus uses a diffractive optical element 110 instead of the convex lens 105 in FIG. 1 in order to shape the beam into a rectangular, linear, or elliptical beam.

That is to say, the laser irradiation apparatus comprises a laser oscillator 101, two polarizing plates 102 and 103, a mirror 104, and a diffractive optical element 110. The laser oscillator 101 is a CW laser oscillator, which is similar to that in FIG. 1. As a solid-state laser, a YAG laser, a $YVO_4$ laser, a YLF laser, a $YAlO_3$ laser, a $GdVO_4$ laser, a $Y_2O_3$ laser, an alexandrite laser, or a Ti:sapphire laser can be used. As a gas laser, an Ar laser, a Kr laser, or a $CO_2$ laser can be used. A pulsed laser can be used instead of the CW laser. As the pulsed laser, a $YVO_4$ laser, a $GdVO_4$ laser, a YAG laser, or the like which has a repetition frequency of 10 MHz or more can be used.

The diffractive optical element 110 is also referred to as a DOE or a diffractive optics. This element is to obtain the desired energy by using the diffraction of light, and also serves as a condensing lens by forming many grooves on its surface. With this diffractive optical element 110, a laser beam emitted from the CW laser oscillator 101 which has Gaussian energy distribution can be shaped into a rectangular, linear, or elliptical beam having homogeneous energy distribution. The other elements except the diffractive optical element 110 are the same as those in FIG. 1; therefore the description of the details is omitted.

The non-single crystal semiconductor film 106 can be crystallized homogeneously by scanning the laser beam back and forth while changing the beam intensity to anneal the non-single crystal semiconductor film 106 similarly to FIG. 1 with such a laser irradiation apparatus.

The present invention is not limited to the constitution of the above embodiment and can be modified appropriately within the scope of the present invention. For example, a beam splitter or an ND filter (neutral density filter) can be used instead of the polarizing plates and the like as means for varying beam intensity to adjust the intensity of the laser beam. In this case, when the beam splitter or the ND filter is sensitive to the laser, the beam diameter of the laser beam may be expanded with a beam expander to decrease the energy density. In the case of using a laser oscillator in which the output of the laser beam can be adjusted by changing the intensity of an excitation light source of the laser, the intensity of the excitation light source may be changed.

Embodiment 2

This embodiment describes a process for manufacturing a thin film transistor (a TFT) using a laser annealing apparatus according to the present invention.

Figure 10A:
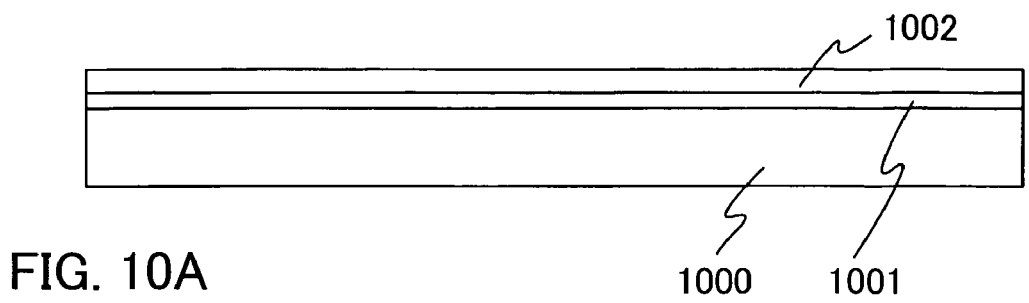
FIGS. 10A to 10D schematically show a process of manufacturing a TFT according to the present invention.

As shown in FIG. 10A, a base film 1001 is formed over a substrate 1000 having an insulating surface. A glass substrate is used as the substrate 1000 in this embodiment. As the substrate used here, a glass substrate made of barium borosilicate glass or alumino borosilicate glass, a quartz substrate, a ceramic substrate, a stainless steel substrate, or the like can be used. Although a substrate made from a flexible material typified by plastic, acrylic, or the like generally tends to be inferior to the above substrates in point of the resistance against the heat, the substrate made of the flexible material can be used when the substrate can resist the heat generated in the manufacturing process.

The base film 1001 is provided in order to prevent an alkali-earth metal or an alkali metal such as Na included in the substrate 1000 from diffusing into the semiconductor film. The alkali-earth metal or the alkali metal causes an adverse effect on the characteristic of the semiconductor element when the metal is in the semiconductor. Therefore, the base film is formed with an insulating material such as silicon oxide, silicon nitride, or silicon nitride oxide, which can suppress the diffusion of the alkali-earth metal and alkali metal into the semiconductor. Further, the base film 1001 may have either a single-layer structure or a multilayer structure. In the present embodiment, a silicon nitride oxide film is formed in thickness from 10 to 400 nm by a plasma CVD (Chemical Vapor Deposition) method.

When the substrate 1000 is a substrate including even a small amount of the alkali metal or the alkali-earth metal such as a glass substrate or a plastic substrate, it is effective to provide the base film in order to prevent the diffusion of the impurity. When a substrate such as a quartz substrate is used which hardly diffuses the impurity, the base film 1001 is not always necessary to be provided.

Next, an amorphous semiconductor film 1002 is formed over the base film 1001 in thickness from 25 to 100 nm (preferably from 30 to 60 nm) by a known method (a sputtering method, an LPCVD method, a plasma CVD method, or the like). The amorphous semiconductor film 1002 may be formed with silicon, silicon germanium, or the like, and silicon is used in this embodiment. When silicon germanium is used, it is preferable that the concentration of germanium be in the range of approximately 0.01 to 4.5 atomic %.

Figure 10B:
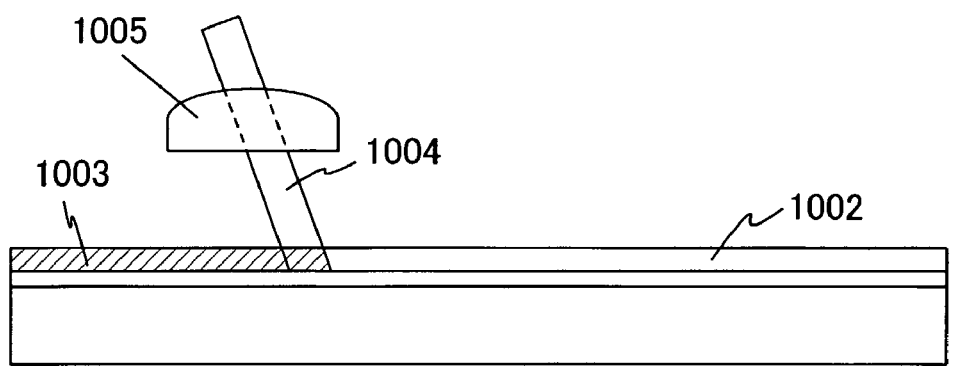

Next, as shown in FIG. 10B, the amorphous semiconductor film 1002 is irradiated with a laser beam using a laser annealing apparatus of the present invention so that the semiconductor film is crystallized. In this embodiment, the irradiation is conducted with a convex lens 1005 and a $Nd:YVO_4$ laser that provides 10 W at the second harmonic with the spatial profile of $TEM_{00}$ mode (single transverse mode). Not only this laser but also another laser can be used. As a continuous wave (CW) solid-state laser, a YAG laser, a YLF laser, a $YAlO_3$ laser, a $GdVO_4$ laser, a $Y_2O_3$ laser, an alexandrite laser, or a Ti:sapphire laser is given. As a CW gas laser, an Ar laser, a Kr laser, or a $CO_2$ laser is given. Further, a $YVO_4$ laser, a $GdVO_4$ laser, a YAG laser, and the like which have a pulse repetition frequency of 10 MHz or more can also be used.

By annealing the semiconductor film homogeneously in all the scanning directions, the characteristic of an electronic appliance can be stabilized in a good condition. However, when a TFT is manufactured using a semiconductor film annealed alternately in directions shown in FIGS. 6 and 7, the crystallization state of the semiconductor film in the TFT varies according to the forward and backward directions. This causes significant effect on the characteristic of the electronic appliance.

In this embodiment, the semiconductor film is annealed homogeneously in all the scanning directions by using a polarizing plate as means for varying beam intensity. Here, the beam intensity may be adjusted in such a way that a layout is inputted to a control device for controlling a motor which moves the polarizing plate such as a computer in advance, the control device sends signals for controlling the motor in accordance with the inputted layout, and the motor which has received the signals moves the polarizing plate.

Moreover, by using the slit, a low-intensity part of the laser beam can be blocked; therefore a linear, elliptical, or rectangular laser beam having a predetermined intensity or more can be delivered.

Figure 10C:
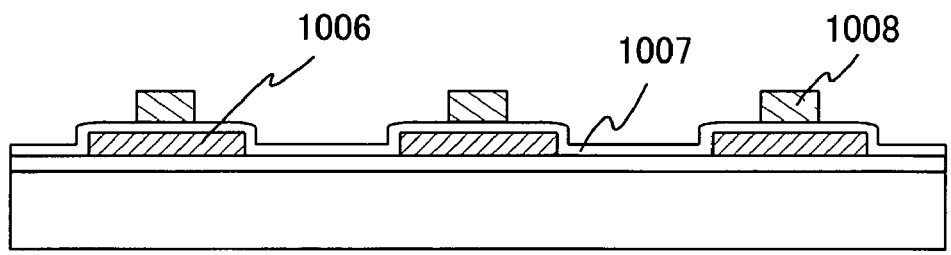

After that, as shown in FIG. 10C, a crystalline semiconductor film 1003 formed by the laser irradiation is patterned to form an island-shaped semiconductor film 1006. Then, a gate insulating film 1007 is formed so as to cover the island-shaped semiconductor film 1006. The gate insulating film 1007 can be formed with silicon oxide, silicon nitride, silicon nitride oxide, or the like by the plasma CVD method or the sputtering method. In this embodiment, a silicon nitride oxide film is formed in 115 nm thick by the plasma CVD method.

Next, a conductive film is formed over the gate insulating film 1007 and patterned to form a gate electrode 1008. After that, a source region 1009, a drain region 1010, an LDD region 1011, and the like are formed by adding an impurity imparting n-type or p-type conductivity to the island-shaped semiconductor film 1006 using the gate electrode 1008 or a patterned resist as a mask. According to the above step, N-channel TFTs 1012 and 1014 and a P-channel TFT 1013 can be formed over the same substrate.

Figure 10D:
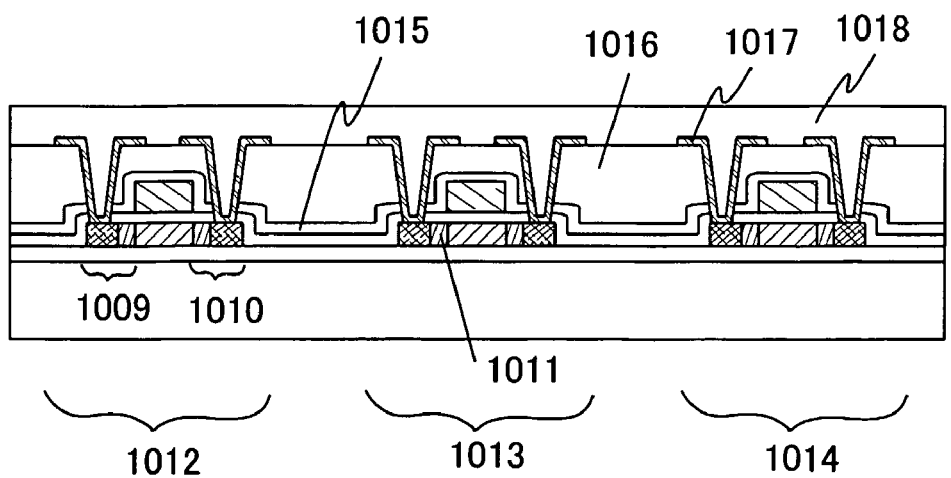

Subsequently, as shown in FIG. 10D, an insulating film 1015 is formed as a protecting film for those TFTs. The insulating film 1015 is formed with silicon nitride or silicon nitride oxide in thickness from 100 to 200 nm in a single-layer or multilayer structure. In this embodiment, a silicon oxynitride film is formed in 100 nm thick by the plasma CVD method. With the insulating film 1015, it is possible to obtain a blocking effect for preventing the intrusion of oxygen and moisture in the air and various ionic impurities.

Next, an insulating film 1016 is formed. In this embodiment, an organic resin film such as polyimide, polyamide, BCB (benzocyclobutene), acrylic, or siloxane, a TOF film, an inorganic interlayer insulating film (an insulating film including silicon such as silicon nitride or silicon oxide), a low-k (low dielectric constant) material, or the like can be used. Siloxane is a material which has a bond of silicon and oxygen expressed with —Si—O—Si— (siloxane bond) as a basic unit and has a constitution in which silicon is combined with fluorine, aliphatic hydrocarbon, aromatic hydrocarbon, or the like. Since the insulating film 1016 is formed mainly for the purpose of relaxing and flattening the unevenness due to the TFTs formed over the glass substrate, a film being superior in flatness is preferable.

Moreover, an insulating film and an organic insulating film are patterned by a photolithography method to form contact holes that reach the impurity regions.

Next, a conductive film is formed with a conductive material, and a wiring 1017 is formed by patterning the conductive film. After that, when an insulating film 1018 is formed as a protective film, a semiconductor device shown in FIG. 10D is completed. It is to be noted that the method for manufacturing a semiconductor device using the laser annealing method of the present invention is not limited to the above method for manufacturing a TFT.

Before the laser crystallization step, a crystallization step using a catalyst element may be provided. As the catalyst element, nickel (Ni), germanium (Ge), iron (Fe), palladium (Pd), tin (Sn), lead (Pb), cobalt (Co), platinum (Pt), copper (Cu), or gold (Au) can be used.

When the crystallization step by the laser irradiation is performed after the crystallization step using the catalyst element, it is possible to enhance the crystallinity of the semiconductor film further and to suppress the roughness of the surface of the semiconductor film after the laser crystallization, compared to the case in which the semiconductor film is crystallized only by the laser irradiation. Therefore, the variation of the characteristics of the semiconductor element to be formed afterward typified by a TFT can be more suppressed and the off-current can be suppressed.

It is to be noted that the crystallization may be performed in such a way that after the catalyst element is added, the heat treatment is performed in order to promote the crystallization, and then the laser irradiation is conducted. Alternatively, the heat treatment may be omitted. Further, the laser process may be performed after the heat treatment while keeping the temperature.

Although the present embodiment shows an example in which the laser irradiation method of the present invention is used to crystallize the semiconductor film, the laser irradiation method may be applied to activate the impurity element doped in the semiconductor film. Moreover, the method for manufacturing a semiconductor device of the present invention can be applied to a method for manufacturing an integrated circuit and a semiconductor display device.

A transistor used for a functional circuit such as a driver or a CPU (central processing unit) preferably has an LDD structure or a structure in which the LDD overlaps the gate electrode. It is desirable to miniature the transistor in order to increase the speed. Since the transistor completed according to the present embodiment has the LDD structure, the transistor is preferably used for a driver circuit requiring high-speed operation.

Embodiment 3

According to the present invention, various electronic appliances can be completed using thin film transistors. Specific examples are described with reference to FIGS. 11A to 11C.

Figure 11A:
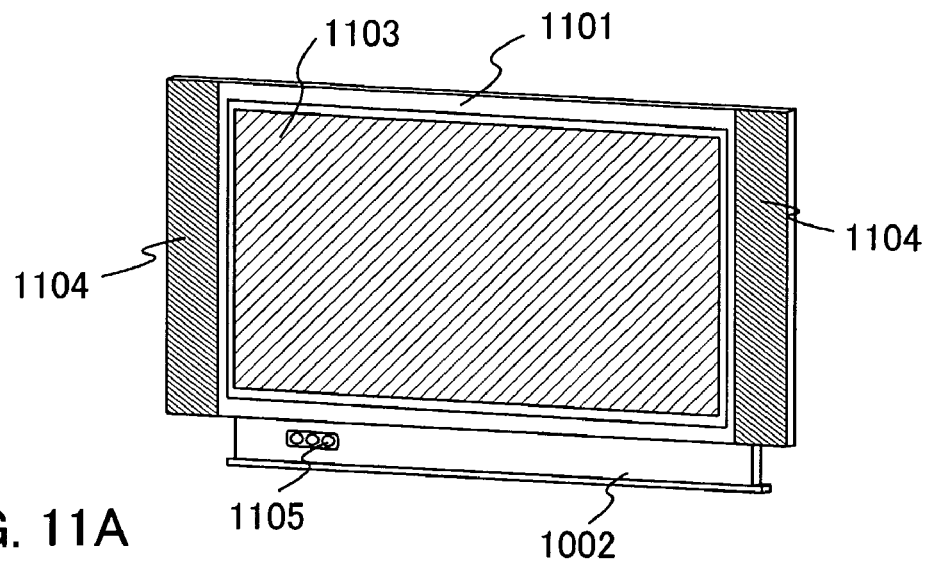
FIGS. 11A to 11C schematically show electronic appliances according to the present invention.

FIG. 11A shows a display device including a case 1101, a supporting stand 1102, a display portion 1103, speaker portions 1104, a video input terminal 1105, and the like. This display device is manufactured by applying the thin film transistors, which have been formed by the manufacturing method shown in FIGS. 10A to 10D, in the display portion 1103. It is to be noted that the display device includes a liquid crystal display device and a light-emitting device, specifically all kinds of display devices for displaying information for a computer, television reception, advertisement, and so on.

Figure 11B:
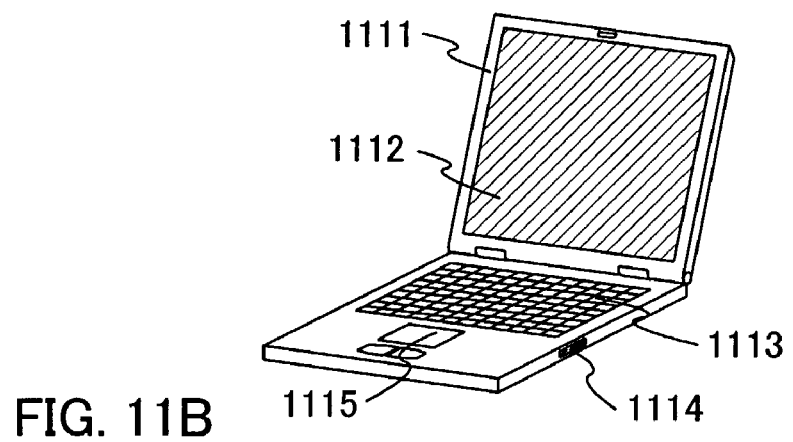

FIG. 11B shows a computer including a case 1111, a display portion 1112, a keyboard 1113, an external connection port 1114, a pointing mouse 1115, and the like. By applying the manufacturing method shown in FIGS. 10A to 10D, the display portion 1112 and other circuits can be manufactured. Further, the present invention can be applied to another semiconductor device such as a CPU and a memory inside the main body.

Figure 11C:
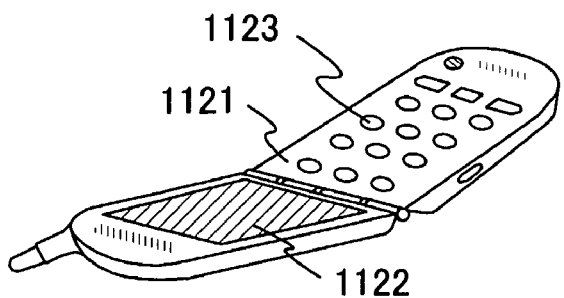

FIG. 11C shows a mobile phone, which is a typical example of mobile terminals. This mobile phone includes a case 1121, operation keys 1122, a display portion 1123, and the like. In addition to the mobile phone, since electronic appliances such as a PDA (personal digital assistant), a digital camera, and a small game machine are mobile terminals, their display screens are small. Therefore, by forming the functional circuits such as a CPU and a memory with the small transistors shown in FIGS. 10A to 10D, smaller and more light-weight appliances can be achieved.

The thin film transistor manufactured in this embodiment can be used as an ID chip. For example, by the manufacturing method shown in FIGS. 10A to 10D, the transistors can be applied as an integrated circuit and a memory in the ID chip or as an ID tag. When the transistors are used as the memory, a circulation process of a product and a process of a production step such as a production area, a producer, a manufacturing date, and a process method can be recorded. It becomes easy for wholesalers, retailers, and consumers to know these information.

Further, in the case of using the TFTs as an ID tag with a radio-frequency function mounted, settlement of products and inventory work can be simplified by using the ID tags instead of conventional barcodes. Moreover, forgetting the settlement and shoplifting can be prevented by inputting that the settlement has been done into the ID tag at the settlement, and checking the ID tag whether the settlement has been done by checking means provided at the exit.

As thus described, the semiconductor device manufactured according to the present invention can be applied in a wide range, and the semiconductor device manufactured according to the present invention can be applied to various electronic appliances in various fields.

Explanation of Reference

1: LASER OSICILLATOR, 2: CYLINDRICAL LENS ARRAY, 3: CYLINDRICAL LENS ARRAY, 4: CYLINDRICAL LENS ARRAY, 5: CYLINDRICAL LENS ARRAY, 6: CYLINDRICAL LENS ARRAY, 7: MIRROR, 8: DOUBLET CYLINDRICAL LENS, 9: IRRADIATION SURFACE, 11: LASER OSCILLATOR, 12: MIRROR, 13: CONVEX LENS, 14: BEAM, 15: IRRADIATION SURFACE, 101: LASER OSCILLATOR, 102: POLARIZING PLATE, 103: POLARIZING PLATE, 104: MIRROR, 105: CONVEX LENS, 106: NON-SINGLE CRYSTAL SEMICONDUCTOR FILM, 107: SUBSTRATE, 108: X-AXIS STAGE, 109: Y-AXIS STAGE, 110: DIFFRACTIVE OPTICAL ELEMENT, 120: BEAM, 121: INCIDENT BEAM, 1000: SUBSTRATE, 1001: BASE FILM, 1002: AMORPHOUS SEMICONDUCTOR FILM, 1003: CRYSTALLINE SEMICONDUCTOR FILM, 1005: CONVEX LENS, 1006: SEMICONDUCTOR FILM, 1007: GATE INSULATING FILM, 1008: GATE ELECTRODE, 1009: SOURCE REGION, 1010: DRAIN REGION, 1011: LDD REGION, 1012: N-CHANNEL TFT, 1013: P-CHANNEL TFT, 1014: N-CHANNEL TFT, 1015: INSULATING FILM, 1016: INSULATING FILM, 1017: WIRING 1018: INSULATING FILM, 1101: CASE, 1102: SUPPORTING STAND, 1103: DISPLAY PORTION, 1104: SPEAKER PORTIONS, 1105: VIDEO INPUT TERMINAL, 1111: CASE, 1112: DISPLAY PORTION, 1113: KEYBOARD, 1114: EXTERNAL CONNECTION PORT, 1115: POINTING MOUSE, 1121: CASE, 1122: OPERATION KEYS, 1123: DISPLAY PORTION

The invention claimed is:

1. A laser irradiation method comprising:
delivering a laser beam to a semiconductor layer;
scanning the semiconductor layer to a first direction with the laser beam in a first intensity; and
scanning the semiconductor layer to a second direction with the laser beam in a second intensity,
wherein the first intensity is larger than the second intensity,
wherein the first direction is a forward direction, and
wherein the second direction is a backward direction.

2. The laser irradiation method according to claim 1, wherein the laser beam is delivered obliquely to the semiconductor layer.

3. The laser irradiation method according to claim 1, wherein the semiconductor layer moves to a direction reverse to the first direction, when the semiconductor layer is scanned to a first direction.

4. The laser irradiation method according to claim 1, wherein the semiconductor layer moves to a direction reverse to the second direction, when the semiconductor layer is scanned to a second direction.

5. A laser irradiation method comprising:
emitting a first laser beam;
changing the first laser beam into a second laser beam through means for varying beam intensity which can vary beam intensity;
changing the second laser beam into a third laser beam;
delivering the third laser beam to an irradiation surface; and
scanning the irradiation surface with the third laser beam,
wherein the third laser beam is scanned in a forward direction in a first period,
wherein the third laser beam is scanned in a backward direction in a second period, and
wherein the beam intensity of the second laser beam in the first period is larger than that in the second period.

6. The laser irradiation method according to claim 5, wherein the third laser beam is delivered obliquely to the irradiation surface.

7. The laser irradiation method according to claim 5, wherein the first laser beam is emitted from a laser oscillator.

8. The laser irradiation method according to claim 5, wherein the means for varying beam intensity comprises at least one of polarizing plates and an ND filter.

9. The laser irradiation method according to claim 5, wherein the second laser beam is changed into a third laser beam through at least one of a convex lens and a diffractive optical element.

10. The laser irradiation method according to claim 5, wherein the irradiation surface moves to a direction reverse to a scanning direction, when the irradiation surface is scanned with the third laser beam.

11. The laser irradiation method according to claim 5, wherein the irradiation surface is a surface of a semiconductor layer.

12. A laser irradiation apparatus comprising:
a laser oscillator;
means for varying beam intensity; and
a convex lens;
wherein a laser beam is incident into an irradiation surface,
wherein the irradiation surface is scanned with the laser beam in a forward direction in a first period,
wherein the irradiation surface is scanned with the laser beam in a backward direction in a second period, and
wherein beam intensity is varied between the first period and the second period by the means for varying beam intensity.

13. The laser irradiation apparatus according to claim 12, wherein the laser beam passed through the convex lens has a rectangular, linear, or elliptical shape on the irradiation surface.

14. The laser irradiation apparatus according to claim 12, wherein the means for varying beam intensity comprises at least one of a polarizing plate and an ND filter.

15. The laser irradiation apparatus according to claim 14, wherein the number of the polarizing plates is more than one.

16. The laser irradiation apparatus according to claim 12, wherein the laser oscillator is a continuous wave solid-state laser, gas laser, or metal laser or a pulsed solid-state laser, gas laser, or metal laser.

17. The laser irradiation apparatus according to claim 12, wherein the laser oscillator is one selected from the group consisting of continuous wave or pulsed YAG laser, $YVO_4$ laser, YLF laser, $YAlO_3$ laser, $GdVO_4$ laser, $Y_2O_3$ laser, glass laser, ruby laser, alexandrite laser, and Ti:sapphire laser.

18. The laser irradiation apparatus according to claim 12, wherein the laser oscillator is one selected from the group consisting of an Ar laser, a Kr laser, and a $CO_2$ laser.

19. The laser irradiation apparatus according to claim 12, wherein the laser oscillator is one selected from the group consisting of a $YVO_4$ laser, a $GdVO_4$ laser, and a YAG laser which have a repetition frequency of 10 MHz or more.

20. The laser irradiation apparatus according to claim 12, wherein the laser beam emitted from the laser oscillator is converted into a harmonic by a non-linear optical element.

21. A laser irradiation apparatus comprising:
a laser oscillator;
means for varying beam intensity; and
a diffractive optical element;
wherein a laser beam is incident into an irradiation surface,
wherein the irradiation surface is scanned with the laser beam in a forward direction in a first period,
wherein the irradiation surface is scanned with the laser beam in a backward direction in a second period, and
wherein beam intensity is varied between the first period and the second period by the means for varying beam intensity.

22. The laser irradiation apparatus according to claim 21, wherein the laser beam passed through the diffractive optical element has a rectangular, linear, or elliptical shape on the irradiation surface.

23. The laser irradiation apparatus according to claim 21, wherein the means for varying beam intensity comprises at least one of a polarizing plate and an ND filter.

24. The laser irradiation apparatus according to claim 23, wherein the number of the polarizing plates is more than one.

25. The laser irradiation apparatus according to claim 21, wherein the laser oscillator is a continuous wave solid-state laser, gas laser, or metal laser or a pulsed solid-state laser, gas laser, or metal laser.

26. The laser irradiation apparatus according to claim 21, wherein the laser oscillator is one selected from the group consisting of continuous wave or pulsed YAG laser, $YVO_4$ laser, YLF laser, $YAIO_3$ laser, $GdVO_4$ laser, $Y_2O_3$ laser, glass laser, ruby laser, alexandrite laser, and Ti:sapphire laser.

27. The laser irradiation apparatus according to claim 21, wherein the laser oscillator is one selected from the group consisting of an Ar laser, a Kr laser, and a $CO_2$ laser.

28. The laser irradiation apparatus according to claim 21, wherein the laser oscillator is one selected from the group consisting of a $YVO_4$ laser, a $GdVO_4$ laser, and a YAG laser which have a repetition frequency of 10 MHz or more.

29. The laser irradiation apparatus according to claim 21, wherein the laser beam emitted from the laser oscillator is converted into a harmonic by a non-linear optical element.

30. A laser irradiation apparatus comprising:
a laser oscillator;
means for varying beam intensity; and
a convex lens;
wherein a laser beam is incident obliquely into an irradiation surface,
wherein the irradiation surface is scanned with the laser beam in a forward direction in a first period,
wherein the irradiation surface is scanned with the laser beam in a backward direction in a second period, and
wherein beam intensity is varied between the first period and the second period by the means for varying beam intensity.

31. The laser irradiation apparatus according to claim 30, wherein the laser beam passed through the convex lens has a rectangular, linear, or elliptical shape on the irradiation surface.

32. The laser irradiation apparatus according to claim 30, wherein the means for varying beam intensity comprises at least one of a polarizing plate and an ND filter.

33. The laser irradiation apparatus according to claim 32, wherein the number of the polarizing plates is more than one.

34. The laser irradiation apparatus according to claim 30, wherein the laser oscillator is a continuous wave solid-state laser, gas laser, or metal laser or a pulsed solid-state laser, gas laser, or metal laser.

35. The laser irradiation apparatus according to claim 30, wherein the laser oscillator is one selected from the group consisting of continuous wave or pulsed YAG laser, $YVO_4$ laser, YLF laser, $YAIO_3$ laser, $GdVO_4$ laser, $Y_2O_3$ laser, glass laser, ruby laser, alexandrite laser, and Ti:sapphire laser.

36. The laser irradiation apparatus according to claim 30, wherein the laser oscillator is one selected from the group consisting of an Ar laser, a Kr laser, and a $CO_2$ laser.

37. The laser irradiation apparatus according to claim 30, wherein the laser oscillator is one selected from the group consisting of a $YVO_4$ laser, a $GdVO_4$ laser, and a YAG laser which have a repetition frequency of 10 MHz or more.

38. The laser irradiation apparatus according to claim 30, wherein the laser beam emitted from the laser oscillator is converted into a harmonic by a non-linear optical element.

39. A laser irradiation apparatus comprising:
a laser oscillator;
means for varying beam intensity; and
a diffractive optical element;
wherein a laser beam is incident obliquely into an irradiation surface,
wherein the irradiation surface is scanned with the laser beam in a forward direction in a first period,
wherein the irradiation surface is scanned with the laser beam in a backward direction in a second period, and
wherein beam intensity is varied between the first period and the second period by the means for varying beam intensity.

40. The laser irradiation apparatus according to claim 39, wherein the laser beam passed through the diffractive optical element has a rectangular, linear, or elliptical shape on the irradiation surface.

41. The laser irradiation apparatus according to claim 39, wherein the means for varying beam intensity comprises at least one of a polarizing plate and an ND filter.

42. The laser irradiation apparatus according to claim 41, wherein the number of the polarizing plates is more than one.

43. The laser irradiation apparatus according to claim 39, wherein the laser oscillator is a continuous wave solid-state laser, gas laser, or metal laser or a pulsed solid-state laser, gas laser, or metal laser.

44. The laser irradiation apparatus according to claim 39, wherein the laser oscillator is one selected from the group consisting of continuous wave or pulsed YAG laser, $YVO_4$ laser, YLF laser, $YAlO_3$ laser, $GdVO_4$ laser, $Y_2O_3$ laser, glass laser, ruby laser, alexandrite laser, and Ti:sapphire laser.

45. The laser irradiation apparatus according to claim 39, wherein the laser oscillator is one selected from the group consisting of an Ar laser, a Kr laser, and a $CO_2$ laser.

46. The laser irradiation apparatus according to claim 39, wherein the laser oscillator is one selected from the group consisting of a $YVO_4$ laser, a $GdVO_4$ laser, and a YAG laser which have a repetition frequency of 10 MHz or more.

47. The laser irradiation apparatus according to claim 39, wherein the laser beam emitted from the laser oscillator is converted into a harmonic by a non-linear optical element.

* * * * *